(12) United States Patent
Im

(10) Patent No.: US 7,863,810 B2
(45) Date of Patent: Jan. 4, 2011

(54) ORGANIC LIGHT EMITTING DISPLAY DEVICE

(75) Inventor: Choong-Youl Im, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 836 days.

(21) Appl. No.: 11/605,365

(22) Filed: Nov. 29, 2006

(65) Prior Publication Data

US 2007/0120470 A1 May 31, 2007

(30) Foreign Application Priority Data

Nov. 29, 2005 (KR) .................. 10-2005-0114794

(51) Int. Cl.
*H05B 33/26* (2006.01)

(52) U.S. Cl. ..................................... 313/504

(58) Field of Classification Search .......... 313/498–512
See application file for complete search history.

(56) References Cited

U.S. PATENT DOCUMENTS

2005/0051776 A1* 3/2005 Miyagi et al. ................. 257/72
2005/0179374 A1* 8/2005 Kwak ........................ 313/506
2005/0189878 A1* 9/2005 Shitagami et al. ........... 313/512

FOREIGN PATENT DOCUMENTS

| JP | 2002-015859 | 1/2002 |
|----|-------------|--------|
| JP | 2002-117971 | 4/2002 |
| KR | 10-2003-0094962 | 12/2003 |
| WO | WO 2005/064993 | 7/2005 |

OTHER PUBLICATIONS

Abstract of JP 408064850A to Uda et al.*

* cited by examiner

*Primary Examiner*—Toan Ton
*Assistant Examiner*—Zachary Snyder
(74) *Attorney, Agent, or Firm*—Robert E. Bushnell, Esq.

(57) ABSTRACT

An organic light emitting display device includes a substrate formed of a conductive material and a luminescent element having an organic layer formed on the substrate, and an anode and a cathode interposing the organic layer, wherein the substrate physically contacts the cathode and provides a voltage to the cathode.

18 Claims, 3 Drawing Sheets

ORGANIC LIGHT EMITTING DISPLAY DEVICE

CLAIMS OF PRIORITY

This application makes reference to, incorporates the same herein, and claims all benefits accruing under 35 U.S.C. §119 from an application earlier filed in the Korean Intellectual Property Office on Nov. 29, 2005 and there duly assigned Serial No. 10-2005-0114794.

BACKGROUND OF THE INVENTION

1. Field of the Invention

The present invention relates to an organic light emitting display device, and more particularly to an organic light emitting display device in which a voltage drop (i.e., IR drop) can be minimized while using a metal substrate.

2. Description of the Related Art

An organic light emitting display device is a self-luminescent device in which electrons and positive holes injected into organic materials through an anode and a cathode are recombined to generate excitons, and a predetermined wavelength of light beams are generated by energy generated by excitons.

Since the organic light emitting display device does not require a separate light source such as a backlight unit, it can provide some advantages such as low power consumption, a wide angle of view, and a fast response speed in comparison with a liquid crystal display device. Therefore, the organic light emitting display device has been highlighted as a next generation display.

The light emitting elements of the organic light emitting display device include an anode which is an electrode for injecting holes, an organic layer, and a cathode which is an electrode for injecting electrons. The organic layer includes organic materials capable of emitting red, green, and blue light to implement a full-color display.

In addition, the organic layer may have a multi-layer structure that includes an emitting layer (EML), an electron transport layer (ETL), and a hole transport layer (HTL) in order to increase light emitting efficiency by balancing the electrons and the holes. In some cases, the organic layer may further include a separate electron injection layer (EIL) and a hole injection layer (HIL).

Such an organic light emitting display device can be classified into a passive matrix type or an active matrix type, depending on a driving method.

While the passive matrix type of organic light emitting display device has advantages such as a simplified manufacturing process and a low manufacturing cost, it has large power consumption, and does not provide a wide display area.

On the other hand, while the active matrix type organic light emitting display device has shortcomings such as a complicated manufacturing process and a high manufacturing cost in comparison with the passive type of organic light emitting display device, it has advantages such as lower power consumption, a high definition, a fast response speed, a wide angle of view, and a sufficiently thin thickness due to an RGB (red/green/blue) independent drive type.

In addition, the organic light emitting display device can be classified into a bottom emission type, a top emission type, or a dual emission type, depending on a light emitting direction from the organic layer. While the light is emitted in a direction opposite to the substrate having pixels in the top emission type of organic light emitting display device, the light is emitted toward the substrate having pixels in a bottom emission type of organic light emitting display device. The bottom emission type of organic light emitting display device has a relatively high numerical aperture.

Since the light emitted from the organic layer of the pixel is output in a direction opposite to the substrate in the top emission type of organic light emitting display device, one of the anode and the cathode interposing the organic layer should be transparent if the light is output from it.

Typically, the transparent electrode of the organic light emitting display device is formed of a transparent conductive material such as Indium-Tin-Oxide (ITO). Unfortunately, since the transparent conductive material such as ITO has a high resistance value, a voltage drop is generated by the high resistance of the transparent electrode, and irregular brightness is generated in a display device due to the voltage drop.

For this reason, in one of the anode and cathode provided on the top and bottom of the organic layer, and particularly, in reference to the cathode, a cathode power line for supplying a cathode voltage to the cathode is formed of metal. In this case, the cathode voltage provided from the external terminal is applied to the cathode power line, and is provided to the cathode through a contact hole.

However, a voltage drop is generated from such a cathode wire line itself, and a pixel area is limited by the space occupied by the cathode wire line.

SUMMARY OF THE INVENTION

The present invention provides an organic light emitting display device having a construction by which a voltage drop generated by a cathode wire line can be minimized, and loss of a pixel area can be minimized.

According to an aspect of the present invention, there is provided an organic light emitting display device including: a substrate formed of a conductive material; an organic layer formed on the substrate; and an anode and a cathode interposing the organic layer, wherein the substrate is electrically connected to the cathode.

The organic light emitting display device may further include an insulation film interposed between the cathode and the substrate, and the substrate and the cathode may be connected to each other through an opening formed in the insulation film.

The substrate may include a display area and a non-display surrounding the display area, and the opening may be disposed in the non-display area.

A plurality of openings may be provided on both sides of the display area.

The cathode may cover the entire display area.

The substrate may be formed of steel or a steel alloy.

A voltage supplied to the cathode may be applied to the substrate.

According to another aspect of the present invention, there is provided an organic light emitting display device comprising a substrate formed of a conductive material; a thin film transistors formed on the substrate; and a luminescent element formed on the thin film transistor. The luminescent element comprising: an anode connected to a drain electrode of the thin film transistor; an organic layer formed on the anode; and a cathode formed on the organic layer, the cathode being in contact with the substrate to establish an electrical connection therebetween.

The organic light emitting display device may further comprise a bottom insulation layer disposed on the substrate; a gate insulation layer disposed on the bottom insulation layer; an interlayer insulation film disposed on the gate insulation layer; a flattening film disposed on the interlayer insulation film; and a pixel defining film disposed on the flattening film with the cathode being disposed on the pixel defining film, wherein the cathode makes contact with the substrate through an opening formed through the pixel defining film, the flattening film, the interlayer insulation film, the gate insulation layer and the bottom insulation layer.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Hereinafter, exemplary embodiments of the present invention will be described in detail with reference to the attached drawings such that the present invention can be easily put into practice by those skilled in the art. As the invention may be embodied and modified in a variety of forms, and they are not intended to limit the invention.

Figure 1:
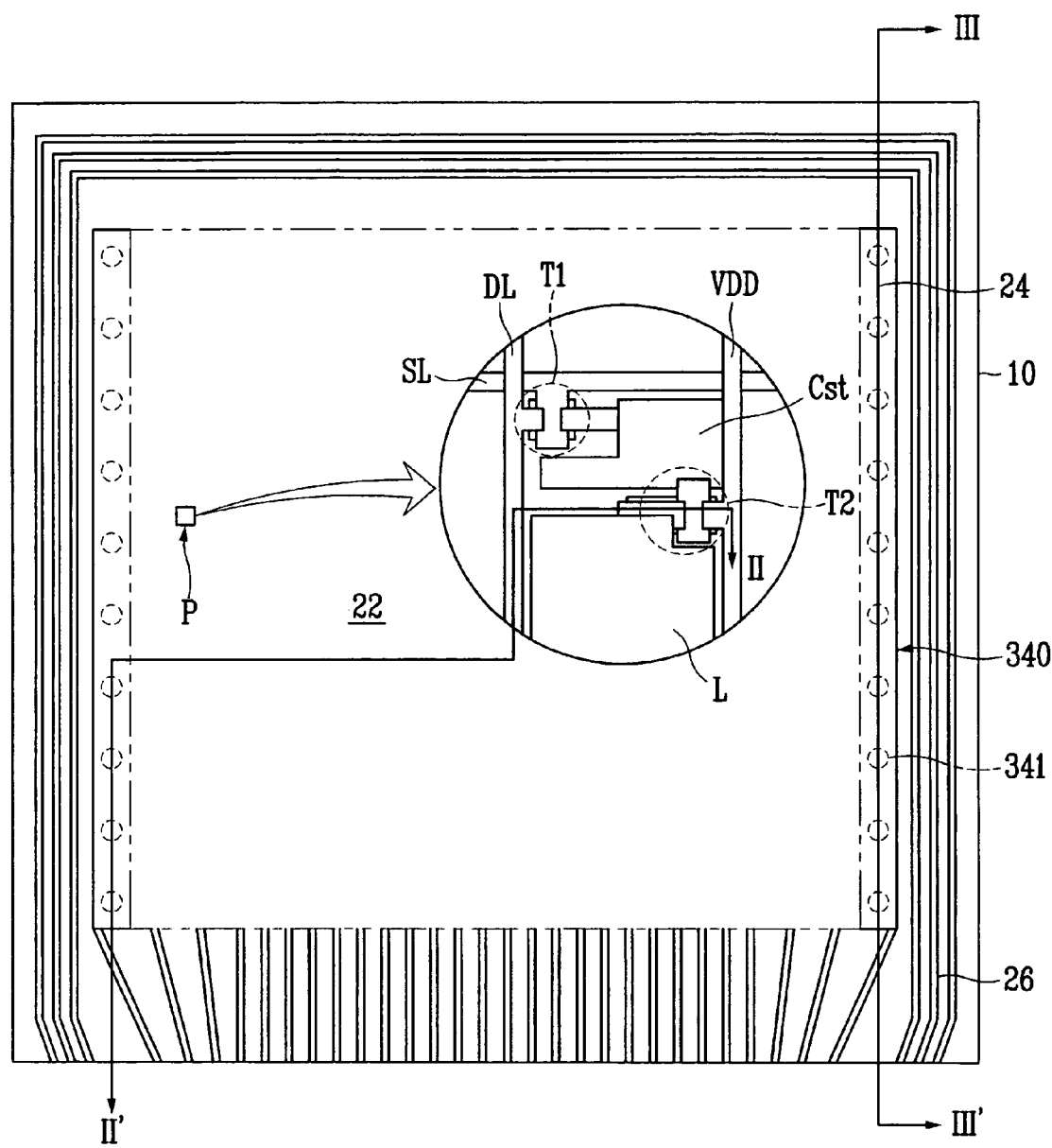
FIG. 1 is a plan view illustrating a substrate of an organic light emitting display device according to an embodiment of the present invention.

FIG. 1 is a plan view illustrating a substrate of an organic light emitting display device according to an embodiment of the present invention. A display area 22 and a non-display area 24 surrounding the display area 22 are provided on a substrate 10 of the organic light emitting display device.

The substrate 10 is formed of a conductive material such as metal including steel or a steel alloy. For example, the substrate 10 may be formed of a steel foil. When the substrate 10 is formed of metal, the organic light emitting display device may be manufactured as a flexible display.

Meanwhile, the pixels are arranged in a matrix shape on the display area 22 provided on the substrate 10. A scan line SL is arranged in a certain direction on each pixel P, and a data line DL and a power line VDD are arranged (perpendicularly) across the scan line SL. Thin film transistors (TFTs) T1 and T2, a capacitor Cst, and a luminescent element L are formed on an area defined by the scan line SL, the data line DL, and the power line VDD.

Thin film transistor T1 is connected to the scan line SL and the data line DL, so as to apply the data voltage input from the data line DL according to a switching signal from the scan line, to a gate electrode of thin film transistor T2. The capacitor Cst is connected to the first thin film transistor T1 and the power line VDD, so as to accumulate electric charges of as much as a voltage difference between the power line VDD and the gate electrode of thin film transistor T2 according to the voltage applied from the data line DL.

The thin film transistor T2 is connected to the power line VDD and the capacitor Cst, so as to supply an output current that is proportional to a square of a difference between a voltage difference $V_{gs}$ stored in the capacitor Cst and a threshold voltage $V_{th}$ of thin film transistor T2 to the luminescent element L. An output current $I_d$ can be expressed as follows:

$$I_d = (\beta/2) \times (V_{gs} - V_{th})^2, \quad \text{[Equation 1]}$$

where $\beta$ is a constant, $V_{gs}$ denotes a voltage difference stored in the capacitor Cst, and $V_{th}$ denotes a threshold voltage.

Although a single thin film transistor T1, a single thin film transistor T2, and a single capacitor Cst are provided in the organic light emitting display device illustrated in FIG. 1, the numbers of the thin film transistors and capacitors are not limited thereto.

Meanwhile, openings 341 for electrically connecting the conductive substrate 10 to the electrodes of the pixels are provided on the non-display area 24 of the substrate 10.

According to an embodiment of the invention, the openings 341 are arranged on both sides of the display area 22, and a plurality of openings may be provided. The arrangement and the number of openings 341 are not limited to those shown in the drawing, and may be changed depending on requirements. A detailed construction of the openings 341 will be described in detail later.

Meanwhile, a wire line 26 including a scan line extension, a power line extension, and a data line extension extended from the scan line SL, the power line VDD, and the data line DL, respectively, and an external signal line connected to an external drive circuit (not shown in the drawing) are arranged around the non-display area 24 provided on the substrate 10. The arrangement of the wire line 26 is not limited to that shown in the drawing.

Figure 2:
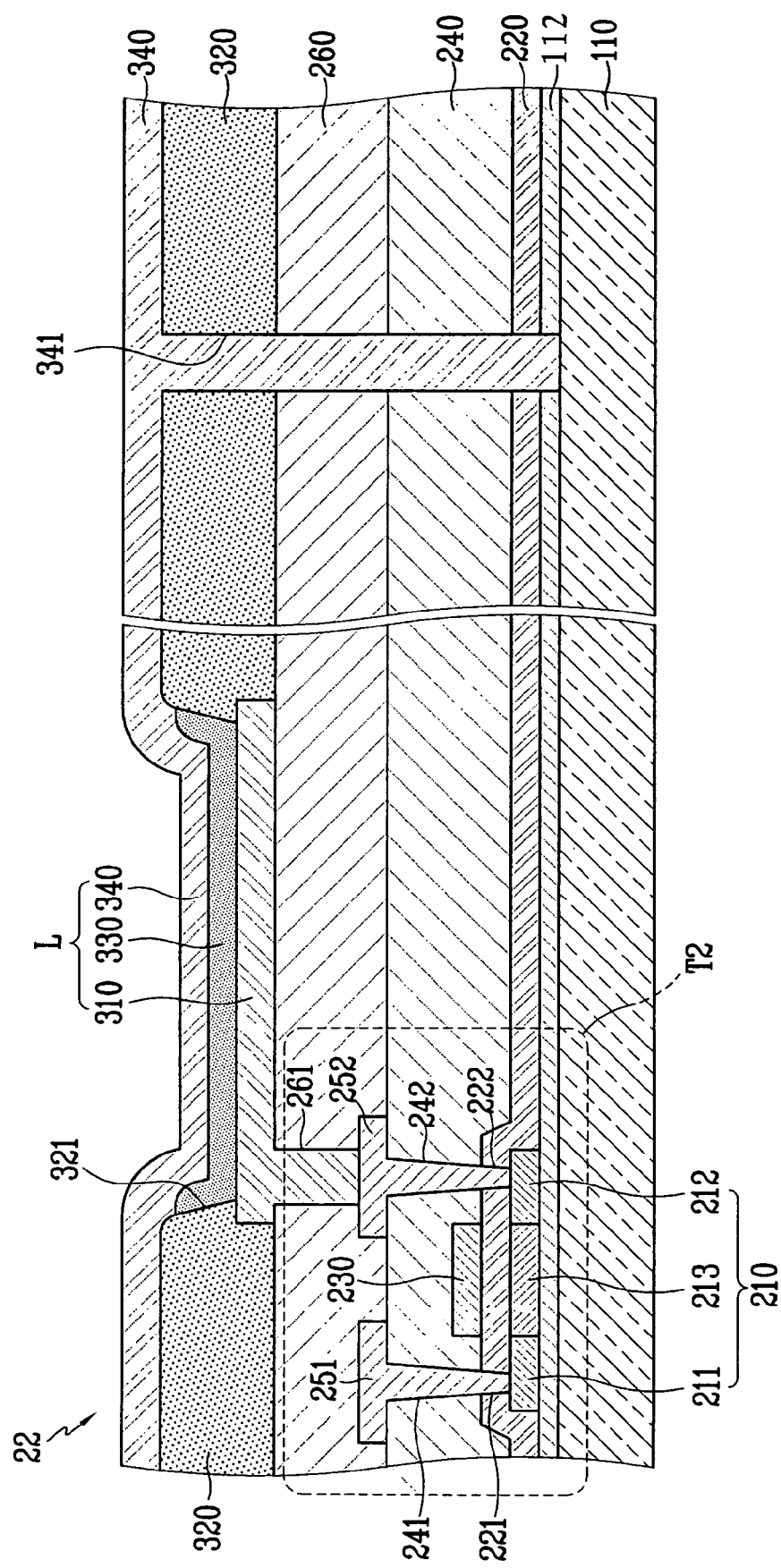
FIG. 2 is a cross-sectional view across a line II-II' shown in FIG. 1.

FIG. 2 is a cross-sectional view across a line II' shown in FIG. 1. As shown in FIG. 2, a bottom insulation film 112, an active layer 210, a gate insulation film 220, and a gate electrode 230 are sequentially formed on substrate 110. the active layer is formed in the area of thin film transistor T2. The gate electrode 230 is formed under an interlayer insulation film 240, and a source electrode 251 and a drain electrode 252 are formed on the interlayer insulation film 240.

The active layer 210 includes source and drain regions 211 and 212 onto which impurities are doped, and a channel region 213 interposed therebetween. The gate electrode 230 corresponding to the channel region 213 is formed of metal such as MoW (Molybdenum-tungsten), Al (Aluminum), Cr (Chromium), and Al/Cr.

The source and drain electrodes 251 and 252 are electrically connected to the source and drain regions 211 and 212 of the active layer 210 through contact holes 221 and 222 provided in the gate insulation film 220, and contact holes 241 and 242 provided in the interlayer insulation film 240, and they are formed of metal Ti/Al (Ti=Titanium) and Ti/Al/Ti.

Although the gate 230, source 251 and drain electrodes 252 are disposed on the active layer 210 in the thin film transistor T2 according to an embodiment of the invention, the arrangement of the active layer 210, and the gate 230, source 251 and drain electrodes 252 is not limited thereto.

The luminescent element L is formed on the thin film transistor T2 with a flattening film 260 interposed therebetween, and has a stack structure in which an anode 310, an organic layer 330, and a cathode 340 are sequentially stacked.

The anode 310 is electrically connected to the drain electrode 252 through a via-hole 261 provided in the flattening film 260. In addition, a pixel defining film 320 having an opening 321 is formed on the flattening film 261, so that the corresponding pixel P is electrically separated from neighboring pixels (not shown in the drawing).

The organic layer 330 makes contact with the anode 310 through the opening 321 of the pixel defining film 320.

The anode 310 may have a single layer structure formed of Indium-Tin-Oxide (ITO) or Indium-Zinc-Oxide (IZO), or a multilayer structure obtained by stacking at least two layers including ITO or IZO. The cathode 340 may be formed of MgAg (Magnesium-Silver), ITO, Al, or the like.

Particularly, when the organic light emitting display device is a top emission type in which the light is emitted toward the cathode 340, the anode 310 may have a multilayer structure including ITO/Ag/ATO (Antimony Tin Oxide), and the cathode 340 may be a transparent electrode formed of MgAg or ITO.

The organic layer 330 may be an organic polymeric material or a low-molecular organic material selected from a group consisting of copper phthalocyanine (CuPc), N,N'-Di(naphthalene-1-yl)-N,N'-diphenyl-benzidine and NPB, tris-8-hydroxyquinoline aluminum ($Alq_3$).

For example, when the organic layer 330 is formed of a low-molecular organic material, the organic layer 330 may have a multilayer structure including a hole injection layer (HIL), a hole transport layer (HTL), an emitting layer (EML) and an electron transport layer (ETL).

On the contrary, when the organic layer 330 is formed of an organic polymeric material, the organic layer 330 may include a hole transport layer (HTL) and an emitting layer (EML). The hole transport layer may be formed of polyethylenedioxythiophene (PEDOT), and the emitting layer may be formed of a poly-phenylenevinylene (PPV) based or polyfluorene based material.

Meanwhile, the non-display area 24 has an opening 341 for electrically connecting the cathode 340 with the substrate 110.

Figure 3:
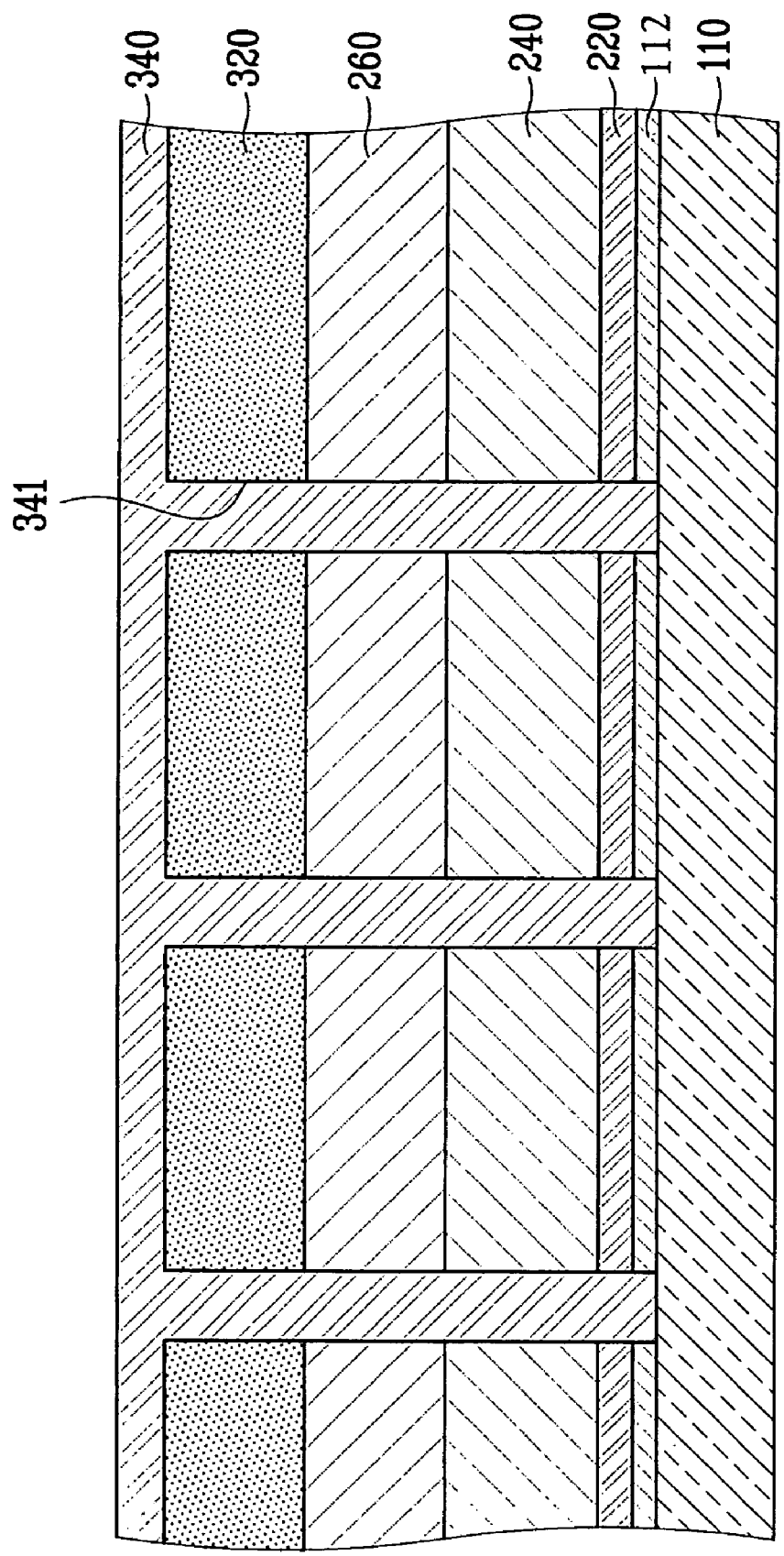
FIG. 3 is a cross-sectional view across a line III-III' shown in FIG. 1.

FIG. 3 is a cross-sectional view across a line II-III' shown in FIG. 1. Referring to FIG. 3, the opening 341 passes through the pixel defining film 320, the flattening film 260, the interlayer insulation film 240, the gate insulation film 220, and the bottom insulation film 112 to connect the cathode 340 to the substrate 110. The opening 341 may have a thru-hole shape as shown in the drawing, and a plurality of openings may be provided on the non-display area 24 around the display area 22.

According to the aforementioned construction, it is possible to apply a voltage to the cathode without a separate metal wire line by connecting the cathode 340 to the substrate 110 formed of metal. Therefore, it is possible to prevent a voltage drop generated in the metal wire line, and it is possible to enlarge the pixel area by forming a wire structure without a separate metal wire line.

According to the organic light emitting display device of the present invention, it is possible to prevent a voltage drop generated in a separate metal wire line by electrically connecting the cathode to the substrate formed of a conductive material. In addition, it is possible to enlarge the pixel area by saving the space for the wire line. Furthermore, it is possible to provide a flexible display unit if the organic light emitting display device according to the invention includes a flexible metallic substrate.

Although the exemplary embodiments of the present invention have been described, the present invention is not limited to the embodiments, but may be modified in various forms without departing from the scope of the appended claims, the detailed description, and the accompanying drawings of the present invention. Therefore, it is natural that such modifications belong to the scope of the present invention.

What is claimed is:

1. An organic light emitting display device comprising:
   a substrate formed of a conductive material, the substrate including a non-display area formed around an edge portion of the substrate and a display area enclosed by the non-display area;
   an organic layer formed on the substrate; and
   an anode and a cathode interposing the organic layer, the cathode being in contact with the non-display area of the substrate to establish an electrical connection between the cathode and the substrate, the cathode being in contact with the substrate only through the non-display area of the substrate.

2. The organic light emitting display device of claim 1, further comprising an insulation film interposed between the cathode and the substrate, wherein the substrate and the cathode contact each other through an opening formed in the insulation film.

3. The organic light emitting display device of claim 2, wherein said opening is disposed in the non-display area.

4. The organic light emitting display device of claim 3, wherein a plurality of openings are provided in non-display areas on opposite sides of the display area.

5. The organic light emitting display device of claim 1, wherein the cathode covers the entire display area.

6. The organic light emitting display device of claim 1, wherein the substrate is formed of metal.

7. The organic light emitting display device of claim 1, wherein the substrate is formed of steel or a steel alloy.

8. The organic light emitting display device of claim 1, wherein a voltage is supplied to the cathode through the substrate.

9. An organic light emitting display device comprising:
   a substrate formed of a conductive material, the substrate including a non-display area formed around an edge portion of the substrate and a display area enclosed by the non-display area;
   a thin film transistor formed on said substrate; and
   a luminescent element connected to said thin film transistor, said luminescent element comprising:
      an anode connected to a drain electrode of said thin film transistor;
      an organic layer formed on said anode; and
      a cathode formed on said organic layer, said cathode being in contact with the non-display area of the substrate to establish an electrical connection between the cathode and the substrate, the cathode being in contact with the substrate only through the non-display area of the substrate.

10. The organic light emitting display device of claim 9, further comprising:
   a bottom insulation layer disposed on said substrate;
   a gate insulation layer disposed on said bottom insulation layer;
   an interlayer insulation film disposed on said gate insulation layer;
   a flattening film disposed on said interlayer insulation film; and
   a pixel defining film disposed on said flattening film with said cathode being disposed on said pixel defining film, wherein the cathode makes contact with the substrate through an opening formed through the pixel defining film, the flattening film, the interlayer insulation film, the gate insulation layer and the bottom insulation layer.

11. The organic light emitting display device of claim 10, wherein said opening is disposed in the non-display area and said luminescent element is disposed in said display area.

12. The organic light emitting display device of claim 11, wherein a plurality of openings are provided in non-display areas on opposite sides of the display area.

13. The organic light emitting display device of claim 9, wherein the cathode covers the entire display area.

14. The organic light emitting display device of claim 9, wherein the substrate is formed of metal.

15. The organic light emitting display device of claim 9, wherein the substrate is formed of steel or a steel alloy.

16. The organic light emitting display device of claim 9, wherein a voltage is supplied to the cathode through the substrate.

17. The organic light emitting display device of claim 2, wherein the cathode entirely covers the opening.

18. The organic light emitting display device of claim 9, wherein both of the thin film transistor and the luminescent element are disposed in the display area.

* * * * *